United States Patent
Luan

(10) Patent No.: US 7,623,368 B2
(45) Date of Patent: Nov. 24, 2009

(54) NON-VOLATILE SEMICONDUCTOR MEMORY BASED ON ENHANCED GATE OXIDE BREAKDOWN

(75) Inventor: Harry Shengwen Luan, Saratoga, CA (US)

(73) Assignee: Kilopass Technology, Inc., Santa Clara, CA (US)

( * ) Notice: Subject to any disclaimer, the term of this patent is extended or adjusted under 35 U.S.C. 154(b) by 0 days.

(21) Appl. No.: 12/330,465

(22) Filed: Dec. 8, 2008

(65) Prior Publication Data

US 2009/0085127 A1    Apr. 2, 2009

Related U.S. Application Data

(62) Division of application No. 11/657,982, filed on Jan. 24, 2007, now Pat. No. 7,471,540.

(51) Int. Cl.
    G11C 7/08    (2006.01)
    G11C 7/00    (2006.01)
(52) U.S. Cl. .................... 365/104; 365/96; 257/530
(58) Field of Classification Search ............. 365/104
    See application file for complete search history.

(56) References Cited

U.S. PATENT DOCUMENTS

| | | | |
|---|---|---|---|
| 6,667,902 B2 * | 12/2003 | Peng | 365/182 |
| 6,671,040 B2 * | 12/2003 | Fong et al. | 365/189.08 |
| 6,700,151 B2 * | 3/2004 | Peng | 257/298 |
| 6,766,960 B2 * | 7/2004 | Peng | 235/492 |
| 6,798,693 B2 * | 9/2004 | Peng | 365/177 |
| 6,956,258 B2 * | 10/2005 | Peng | 257/298 |
| 6,972,986 B2 * | 12/2005 | Peng et al. | 365/149 |
| 7,436,028 B2 * | 10/2008 | Yang et al. | 257/368 |
| 2006/0097325 A1 * | 5/2006 | Yang et al. | 257/368 |
| 2006/0292755 A1 * | 12/2006 | Parris et al. | 438/132 |

* cited by examiner

Primary Examiner—Son L Mai
(74) Attorney, Agent, or Firm—Perkins Coie LLP

(57) ABSTRACT

A semiconductor memory structure based on gate oxide break down is constructed in a deep N-well. Thus, the electrical field over the programmable element during the transient procedure of gate oxide break down can be controlled to achieve the best memory programming results. The conductivity of the programmed memory cell is increased greatly and conductivity variation between the memory cells is reduced. This is achieved by adding a body bias during the programming process. The body here refers to a P-well formed within the deep N-Well. Furthermore, the read voltage offset is reduced greatly with this new memory configuration. These improved programming results will allow faster read speed and lower read voltage. This new structure also reduces current leakage from a memory array during programming.

11 Claims, 6 Drawing Sheets

TABLE 1: memory array operation condition

| PGM | Vwlp | Vwlr | Vbl |
|---|---|---|---|
| SWSB | Vpp | Vpp/2 | 0 |
| SWUB | Vpp | Vpp/2 | Vpp/2 |
| UWSB | 0 or Vpp/2 | 0 | 0 |
| UWUB | 0 or Vpp/2 | 0 | Vpp/2 |

NON-VOLATILE SEMICONDUCTOR MEMORY BASED ON ENHANCED GATE OXIDE BREAKDOWN

CROSS-REFERENCE TO RELATED APPLICATION

This application is a divisional application of U.S. patent application Ser. No. 11/657,982, filed Jan. 24, 2007 now U.S. Pat. No. 7,471,540 and entitled NON-VOLATILE SEMICONDUCTOR MEMORY BASED ON ENHANCED GATE OXIDE BREAKDOWN, the disclosure of which is hereby incorporated by reference in its entirety.

TECHNICAL FIELD OF THE INVENTION

The present invention relates to a nonvolatile programmable semiconductor memory, and more particularly to a body-effect enhanced memory cell, that is formed inside a deep N-well, programmed by breakdown of gate oxide.

BACKGROUND OF THE INVENTION

Nonvolatile memory (NVM) retains stored data when power is removed, which is desired in many different applications. One type of NVM is the one time programmable (OTP) memory based on thin dielectric breakdown. This type semiconductor memory cell has a data storage element (programmable element) constructed around a thin dielectric layer, such as a gate oxide. The digital information "one" or "zero" stored in the memory cell is formed by stressing the thin dielectric into breakdown (soft or hard breakdown) to set the read current level of the memory cell. The memory cell is read by sensing the current drawn by the cell.

A suitable thin dielectric is high quality gate oxide of about 50 angstroms thick or less, as commonly available from advanced CMOS logic processes. Various details of such NVM memory can be found in U.S. Pat. No. 6,667,902 entitled "Semiconductor Memory Cell and Memory Array Using a Breakdown Phenomena in an Ultra-Thin Dielectric", U.S. Pat. No. 6,822,888 entitled "Semiconductor Memory Cell and Memory Array Using a Breakdown Phenomena in an Ultra-Thin Dielectric", and U.S. Pat. No. 6,671,040 entitled "Programming Methods and Circuits for Semiconductor Memory Cell and Memory Array Using a Breakdown Phenomena in an Ultra-Thin Dielectric", commonly assigned to the assignee herein and incorporated by reference.

There are various advantages of OTP semiconductor memory using gate oxide breakdown. First, it is compatible with CMOS processing making it suitable for embedded memory integrated into a CMOS circuit/system. Second, because it is CMOS compatible, it has a shorter development cycle than other memories. Third, it is very secure for the stored information. Once the information is stored, it is nearly impossible for it to be changed without destroying the data. It is also very difficult to decode the information stored, either electronically or physically.

There are still difficulties, however, with current OTP cell using gate oxide breakdown. First, the variation of a programmed cell in terms of its read current is still large. Second, the conductivity of a programmed bit is not as high as desired. Third, the read offset voltage is high. Fourth, the leakage of the memory during programming is relatively high. All of these drawbacks become critical as the semiconductor manufacturing process scales down to and beyond 90 nm.

DETAILED DESCRIPTION

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment.

In accordance with the present invention, a semiconductor memory structure based on gate oxide break down is constructed in a deep N-well. Thus, the electrical field over the programmable element during the transient procedure of gate oxide break down can be controlled to achieve the best memory programming results. The conductivity of the programmed memory cell is increased greatly and conductivity variation between the memory cells is reduced. This is achieved by adding a body bias during the programming process. The body here refers to a P-well formed within the deep N-Well. Furthermore, the read voltage offset is reduced greatly with this new memory configuration. These improved programming results will allow faster read speed and lower read voltage. This new structure also reduces current leakage from a memory array during programming.

Figure 2:
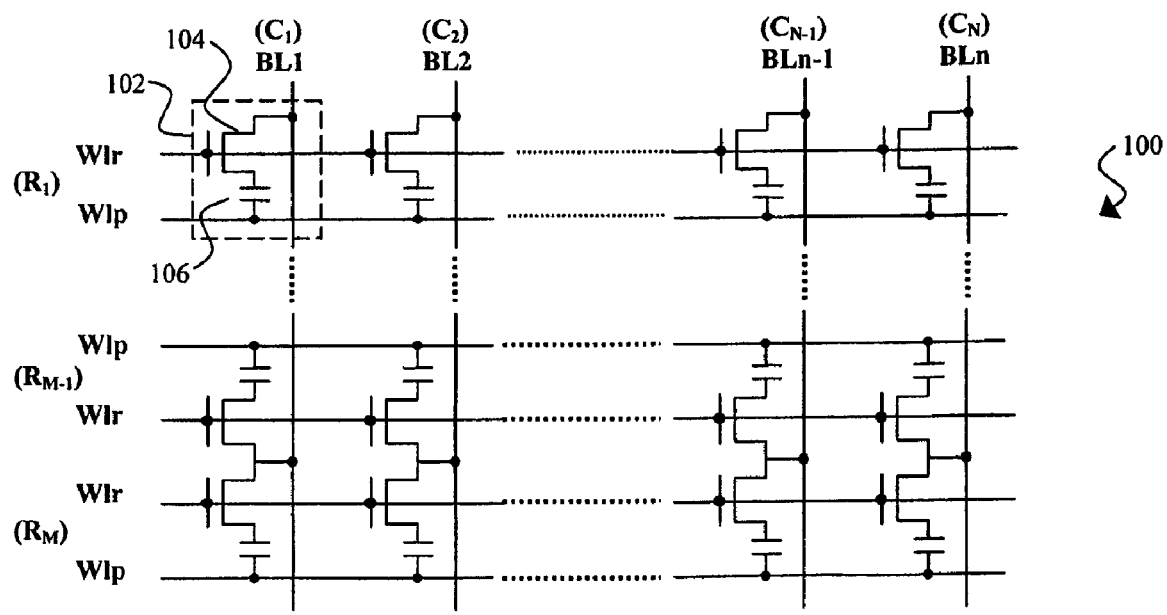
FIG. 2 is a schematic of a semiconductor memory array formed in accordance with the present invention.

An example of an arbitrary N by M portion of a memory array 100 that includes several memory cells 102 is shown in the schematic diagram of FIG. 2, where M and N are arbitrary numbers. In FIG. 2, each memory cell includes a MOS transistor 104 and a MOS half-transistor 106. The MOS transistor 104 is also referred to as a pass transistor or a select transistor. The MOS half-transistor 106 is a programmable element (also referred to as a data storage element) and can be electrically modeled or implemented as a MOS capacitor.

Figure 1:
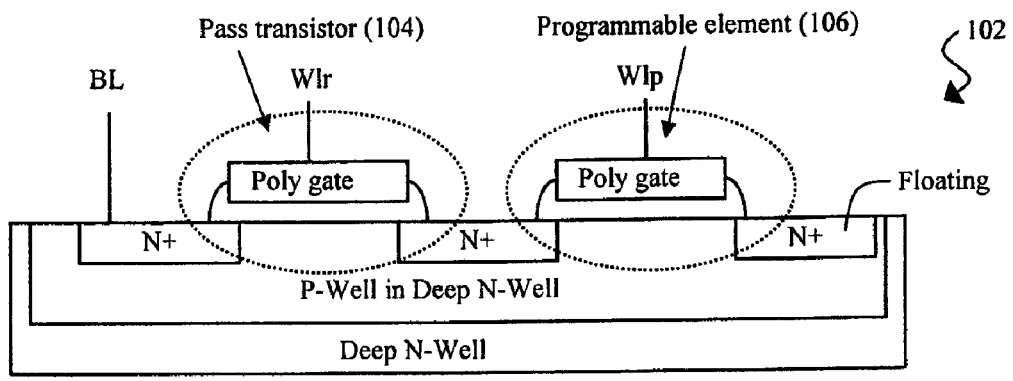
FIG. 1 is a cross section of a semiconductor memory cell formed in accordance with the present invention.

The memory cell at, for example, the crosspoint of the first row $R_1$ and the first column $C_1$ includes an n-channel MOS transistor 104 having its gate connected to a read wordline $W_{LR}$, its source connected to a column bitline $BL_1$, and its drain connected to one terminal of MOS half-transistor 106. Turning to FIG. 1, the MOS half-transistor (programmable element) 106 in one embodiment includes a conductive gate structure formed over an ultra-thin dielectric, typically a gate oxide. On either side of the conductive gate are P-type doped silicon channel regions which are adjacent to the N+ source/drain regions. Thus, the programmable element 106 has a similar structure to a transistor. Because one of the N+ source/drain regions is left floating, the programmable element 106 behaves as a MOS capacitor.

The MOS transistor 104 is also referred to herein as a select transistor and is used to "select" a particular memory cell for programming or reading. As will be seen below, during the programming step, a voltage is applied to the select transistor and MOS half-transistor 106 to break down the gate oxide of the MOS half-transistor 106. However, it is undesirable to break down the gate oxide of the select transistor. Therefore, the gate oxide of the select transistor may be made, in some alternative embodiments, to have a thicker gate oxide than that of the MOS half-transistor 106. Indeed, it would be typical to form the gate oxide of the select transistor to be formed at the same time the gate oxide (also known as an ultra-thin dielectric) of the MOS half-transistor 106. Thus, in one embodiment, the gate oxide of the MOS field effect transistor and the ultra-thin dielectric of the MOS data storage element are formed from a common layer of oxide, though the gate oxide and ultra-thin dielectric may have different thicknesses.

Alternatively, the voltage applied to selector transistor and MOS half-transistor are different to ensure that the gate oxide of the selector transistor is not damaged during programming. In one embodiment, the voltage on selector transistor is half of the programming voltage on 106. Thicker gate oxide layer for selector transistor can be used, but that will increase the cell size significantly in common CMOS processing.

Additionally or in the alternative, the select transistor may be replaced by an I/O device that is more resistant to break down. The gate of the MOS half-transistor 106 is connected to a program wordline WLP. The schematic of FIG. 2 is similar to that shown in U.S. Pat. No. 6,667,902 noted above.

A MOS half-transistor functions as follows. During programming or read, a positive voltage (for a p-type active region) is applied to the gate, which is one terminal of the capacitor. The gate acts as one plate of the capacitor and also causes an n-type inversion layer to form under the gate. The inversion layer acts as the other plate of the capacitor, and together with one of the source/drain regions forms the second terminal of the capacitor.

The use of half-transistor type data storage elements in the array 100 of FIG. 2 is advantageous because the half-transistors can be fabricated using many conventional MOS and CMOS processes without adding any mask steps to them. However, other types of ultra-thin dielectric data storage elements may be used if desired. For example, a capacitor type data storage element advantageously may be programmed in either direction and has less resistance when the ultra-thin dielectric is stressed, but may require an additional masking step in some processes.

The memory array 100 as shown in FIG. 2 may contain on the order from less than 1 k to over one gigabit of memory cells when fabricated using, for example, an advanced 0.09 μm CMOS logic process, and even larger memories will be realized as CMOS logic processes improve further. The memory 100 in practice is organized into bytes and pages and redundant rows (not shown), which may be done in any desired manner. Many suitable memory organizations are well known in the art.

FIG. 1 shows a cross section view of the memory cell 102 of FIG. 2. The memory cell 102 includes the pass transistor 104 having its gate connected to the read wordline WLR and its source connected to the column bitline BL. The drain of the pass transistor 104 is connected to the source of the MOS half-transistor 106. The gate of the MOS half-transistor 106 is connected to the program wordline WLP. Because the MOS half-transistor 106 is acting as a capacitor, the other drain node is left floating.

Figure 3:
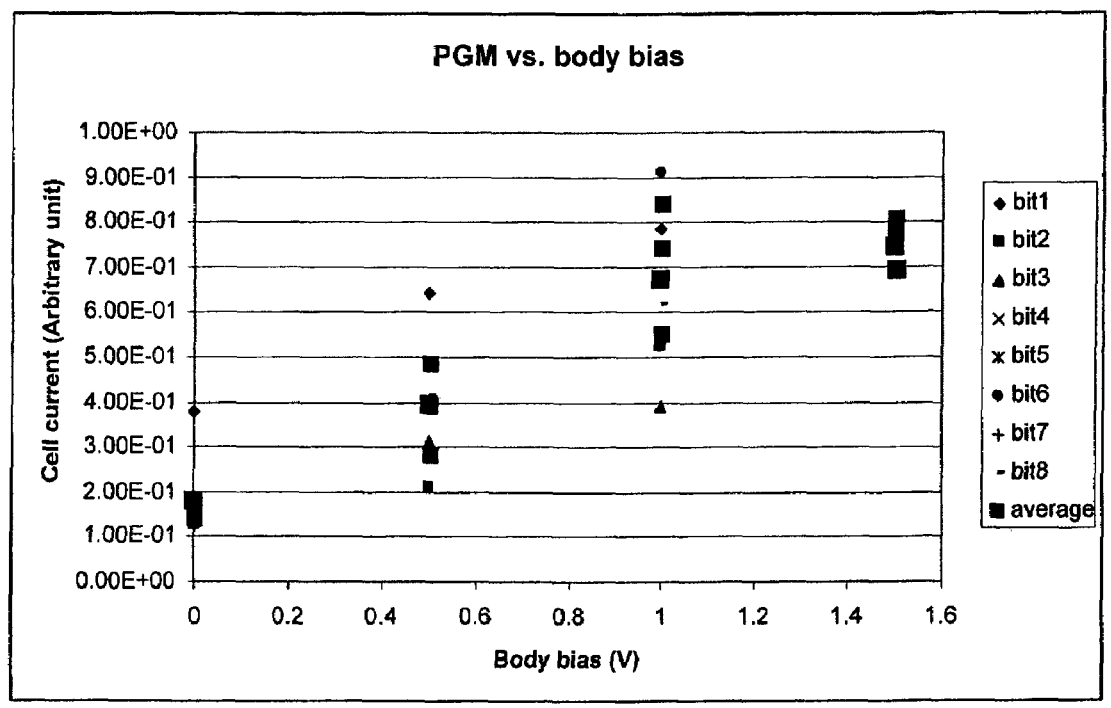
FIG. 3 is a table and graph showing increasing programmed cell current as body bias is increased.

To program a memory cell 102, the programming voltages shown in Table 1 of FIG. 3 are used. To program a memory cell at a selected wordline and selected bitline (SWSB), a voltage of $V_{PP}$ is placed on the program wordline WLP, $V_{PP}/2$ is placed on the read wordline, and the column bitline is at or close to zero volts. The voltages on a memory cell at a selected wordline and unselected bitline (SWUB) are: $V_{PP}$ on the program wordline WLP, and $V_{PP}/2$ on both the read wordline and the column bitline. The voltages on a memory cell at an unselected wordline and a selected bitline (UWSB) are: 0 or $V_{PP}/2$ on the program wordline WLP, and 0 on both the read wordline and the column bitline. The voltages on a memory cell at an unselected wordline and an unselected bitline (UWUB) are: 0 or $V_{PP}/2$ on the program wordline WLP, 0 on the read wordline, and $V_{PP}/2$ on the column bitline.

Unlike the prior art, note that the memory cell 102 of FIG. 1 is formed inside a P-well, which in turn is formed in a deep N-well. The deep N-well, in one embodiment may have a depth of 1.5-3 microns with a doping concentration of $10^{16}$ to $10^{18}$ cm$^{-3}$. With this structure, as will be seen below, the programming process of the memory cell 102 can be improved by biasing the P-well in deep N-Well. Alternatively, the P-well can be left floating. Thus, unlike the prior art, the P-well is not grounded and can be completely decoupled from the peripheral circuits.

FIG. 1 shows that the P-well can be biased to a voltage $V_{BODY}$ through an electrical connection. With a bias on the P-well "body", the inversion layer charge density is enhanced under the gate. The positive body bias also increases the "on" conductance of the read transistor. As a result, better cell programming can be obtained. In one embodiment, the biasing of the P-well is less than one volt, and on the order of less than 0.7 volt. However, it can be appreciated that the precise bias voltage on the P-well should be optimized for the memory size, architecture, and manufacturing process. The present invention can increase the read current and reduce the read voltage offset after programming.

Moreover, bias on the P-well in the deep N-Well will reduce the current leakage from those unselected "one" bits on the selected wordline. This will allow longer wordlines for the memory array, or alternatively, will reduce wordline driver size. The bias on the P-well in the deep N-Well will also reduce the column bitline (BL) leakage from unselected bitlines during programming.

The graph portion of FIG. 3 shows the effect of body bias to programmed cell read current (in arbitrary units). As shown in the plot, the cell current of a programmed memory cell is increased as body bias increases. In this plot, 8 bits were programmed for each body bias condition. The average cell current is a good indication of a typical cell current for body bias. Higher programmed read current will give better memory performance such as shorter read access time and lower read voltage. By biasing the P-well, the programmed read current can be increased. Biasing of the P-well is made possible by forming the P-well in a deep N-well.

Figure 4A:
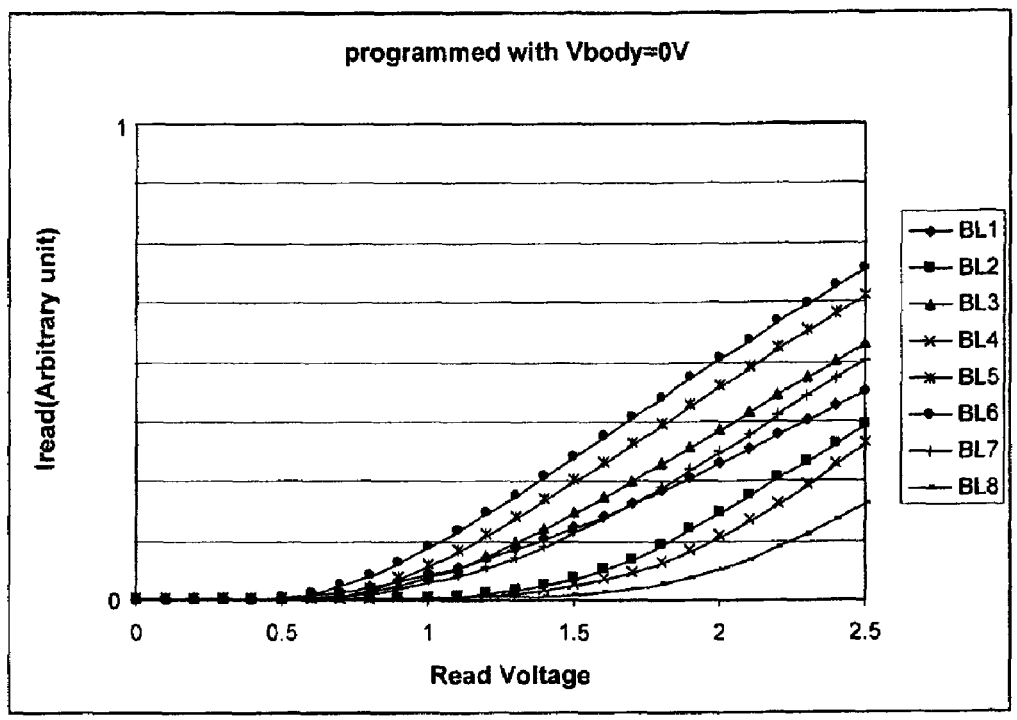
FIG. 4A is a graph showing read current and read voltage of an 8-bit memory array without body bias.
Figure 4B:
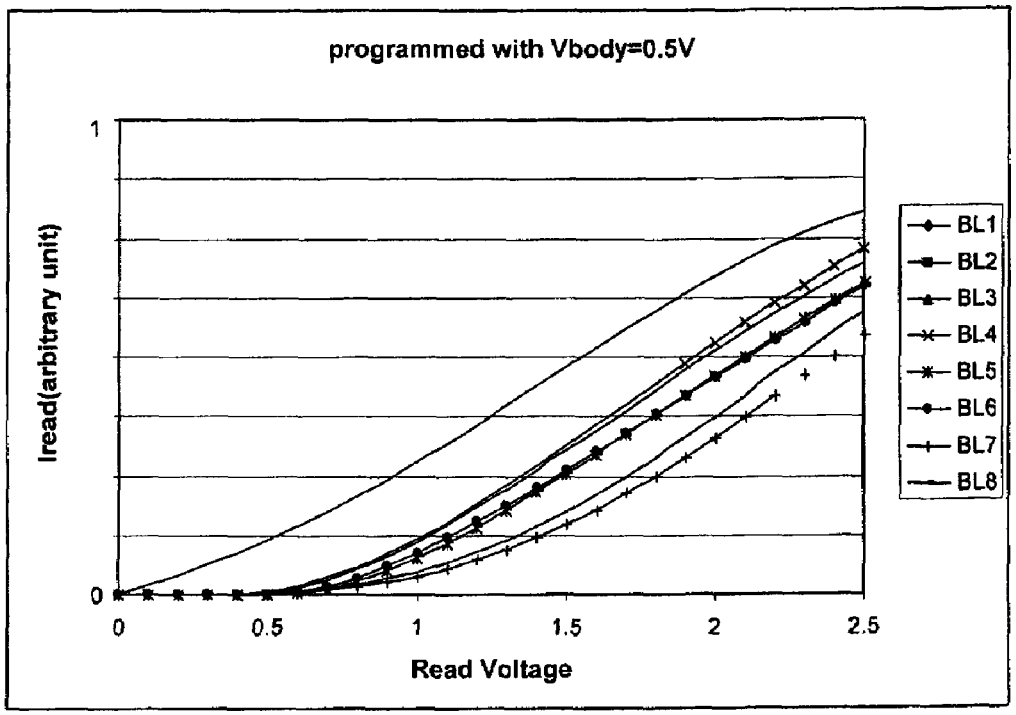
FIG. 4B is a graph showing read current and read voltage of an 8-bit memory array with a 1 volt body bias.

FIG. 4 shows the results of two groups of memory cells programmed with and without body bias. The group of memory cells that were programmed with a 0.5 V volt body bias shows lower read offset voltage (about 0.5V) than that of the group programmed without body bias. In other words, for a given read current detection level, the required read voltage is about 0.5 volts less.

Figure 5:
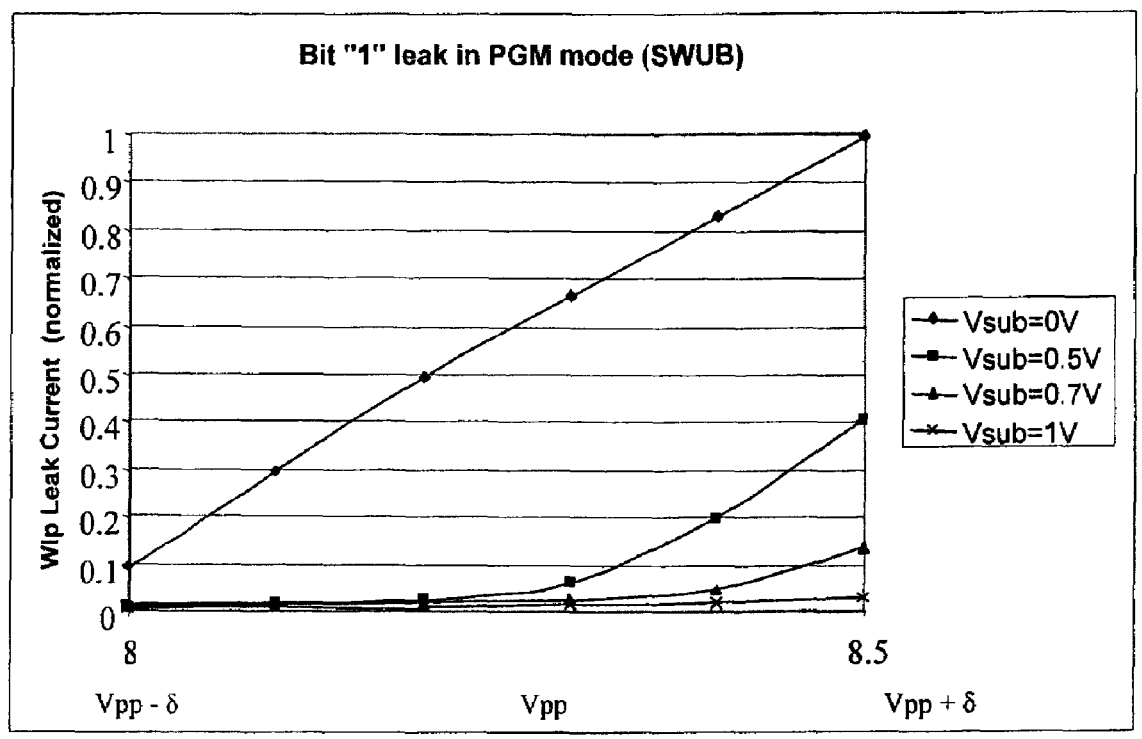
FIG. 5 is a graph of leakage current from a selected wordline unselected bitline programmed memory cell at various body bias voltages.

FIG. 5 is measurement data which demonstrates that the leakage current is reduced from those unselected, but already programmed cells on the selected wordline. Within the programming voltage range, for the worst leakage case (Vpgm=Vpp+δ), 60% and 80% leakage is reduced for 0.5V and 0.7V body-bias respectively, where δ is the programming voltage variation.

Figure 6:
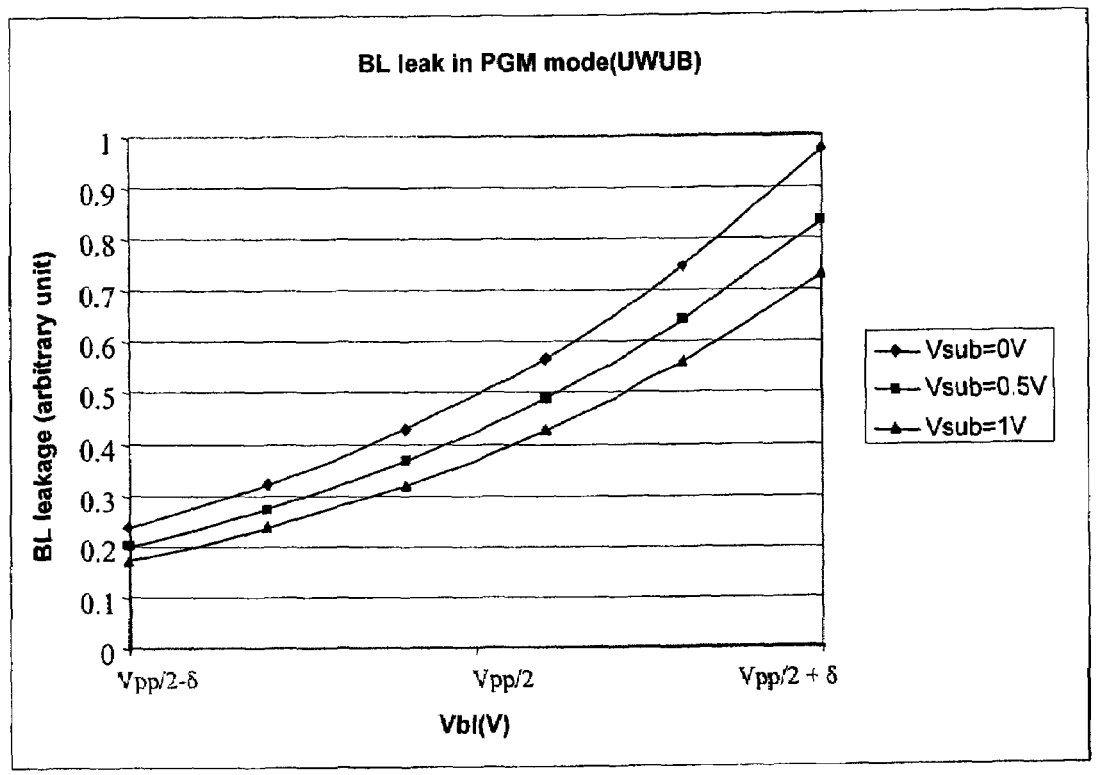
FIG. 6 is a graph of leakage current from an unselected programmed memory cell at various body bias voltages.

FIG. 6 shows the leakage current measured from the column bitlines on the unselected word lines. Around 20% reduction of leakage is achieved at the worst bias case (Vbl=Vpp/2+δ), where δ is bit line voltage variation.

Figure 7:
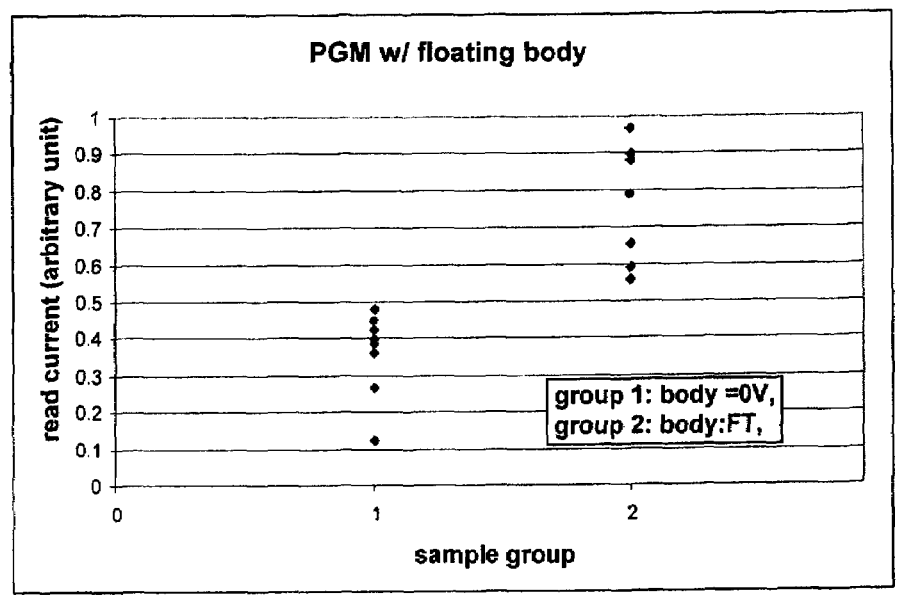
FIG. 7 is a graph showing the read current of memory cells with a floating body and grounded body.

In an alternative embodiment of the invention, the body is left floating during the programming of the memory cell. FIG. 7 shows improved programming results of the memory cell with a floating body. In FIG. 7, sample group 1 was programmed with the body grounded; sample group 2 was programmed with body floating. It is clear from the plots that the read current of the memory cell is improved if a floating body was employed during the programming. The reason that floating body can improve the programming result is that a floating body will be locally charged up during the programming transient, and thus the body-effect enhancement of oxide breakdown is achieved. A decrease of the read voltage offset was also experimentally observed in this embodiment.

Figure 8:
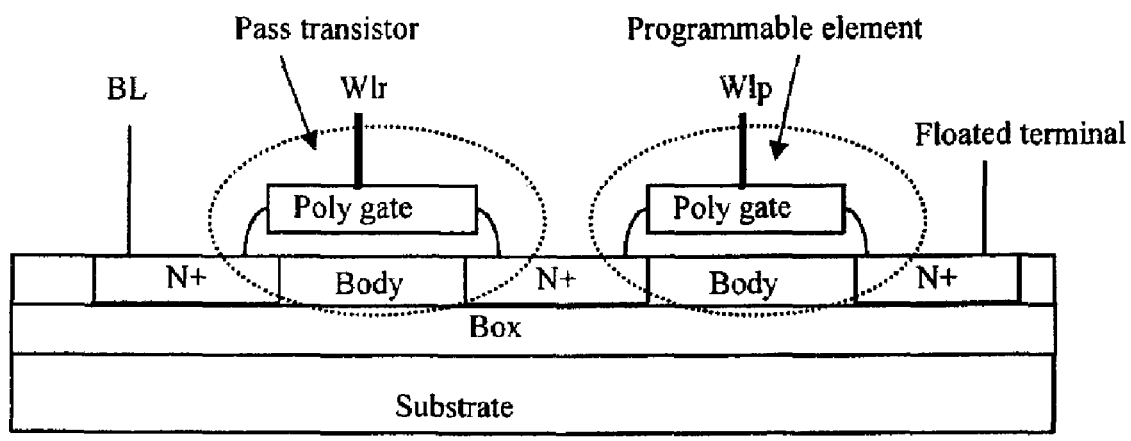
FIG. 8 is a cross section view of a semiconductor memory cell formed on a silicon-on-insulator wafer in accordance with an embodiment of the invention.

Yet another embodiment of the invention is to implement the memory cell on a silicon-on-insulator (SOI) wafer as shown in FIG. 8. The body in this embodiment is isolated by a body oxide (Box). Thus, a floating body results. This embodiment applies to both full-depleted SOI and partially-depleted SOI.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. When the claims use the word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

The invention claimed is:

1. A programmable memory cell comprising:
   a pass transistor having a gate, a gate dielectric underlying the gate, and n-type first and second doped regions in a spaced apart relationship to define a channel region under the gate in a p-type body; and
   a MOS data storage element having a gate and an ultra-thin dielectric underlying the gate, said MOS data storage element coupled to the n-type first doped region of the pass transistor, said MOS data storage element being programmed by breaking down said ultra-thin dielectric;
   wherein said P-type body is formed on top of a body oxide, said body oxide formed atop of a substrate.

2. The memory cell of claim 1 wherein said the MOS data storage element comprises an inversion-enabled region underlying both the ultra-thin dielectric and the gate and adjacent to the n-type first doped region.

3. The memory cell of claim 1 wherein the gate of the said MOS data storage element partially overlaps an isolation field oxide region.

4. The memory cell of claim 1 wherein said MOS data storage element further includes a second doped region adjacent to the gate of the MOS data storage element, said second doped region left electrically floating.

5. The memory cell of claim 1 wherein said P-type body is electrically floating.

6. The memory cell of claim 1 further including an electrical connection to said P-type body for use in applying a body bias voltage $V_{BODY}$.

7. The memory cell of claim 1 wherein said P-type body has a thickness that allows for full depletion during operation of the pass transistor and data storage element.

8. The memory cell of claim 1 wherein said P-type body has a thickness that is partially depleted during operation of the pass transistor and data storage element.

9. A method for programming a memory cell, said memory cell comprising a select transistor and a data storage element coupled in series by a first doped region; the data storage element comprising a gate, an ultra-thin dielectric underlying said gate, said select transistor having a gate that is controllable to address said memory cell, said select transistor and data storage element formed in a P-type body that is above a body oxide, said body oxide formed on top of a substrate, the method comprising:

applying a programming voltage $V_{PP}$ to the gate of the data storage element; and turning on said select transistor.

10. The programming method of claim 9 wherein said P-type body is left floating and isolated by a field oxide and said body oxide.

11. The programming method of claim 9 wherein said P-type body is biased at Vbody through an adjacent body connection.

* * * * *